(12) United States Patent
Oh

(10) Patent No.: US 7,782,703 B2
(45) Date of Patent: Aug. 24, 2010

(54) SEMICONDUCTOR MEMORY HAVING A BANK WITH SUB-BANKS

(75) Inventor: Jong-Hoon Oh, Chapel Hill, NC (US)

(73) Assignee: Qimonda North America Corp., Cary, NC (US)

( * ) Notice: Subject to any disclaimer, the term of this patent is extended or adjusted under 35 U.S.C. 154(b) by 258 days.

(21) Appl. No.: 12/024,877

(22) Filed: Feb. 1, 2008

(65) Prior Publication Data

US 2009/0196116 A1    Aug. 6, 2009

(51) Int. Cl.
*G11C 8/00*    (2006.01)

(52) U.S. Cl. .......................... 365/230.03; 365/230.06; 365/63

(58) Field of Classification Search ............ 365/230.03, 365/230.06, 63
See application file for complete search history.

(56) References Cited

U.S. PATENT DOCUMENTS

| 6,064,621 | A  | * | 5/2000 | Tanizaki et al. | ........ 365/230.03 |
| 2008/0112251 | A1 | * | 5/2008 | Youn et al. | ............. 365/230.03 |

* cited by examiner

*Primary Examiner*—Son Dinh
*Assistant Examiner*—Nam Nguyen
(74) *Attorney, Agent, or Firm*—Patterson & Sheridan, L.L.P.

(57) ABSTRACT

Methods and apparatus that provide an additional level(s) of hierarchy within a bank of a Dynamic Random Access Memory (DRAM) are provided. The bank has a plurality of separately addressable sub-banks.

24 Claims, 7 Drawing Sheets

|  | BANK ADDRESS [1] | BANK ADDRESS [0] | SUB-BANK ADDRESS | RESULT |
|---|---|---|---|---|
| ROW A | 0 | 0 | 0 | SELECT BANK A, SUB-BANK (i) |
| ROW B | 0 | 0 | 1 | SELECT BANK A, SUB-BANK (j) |
| ROW C | 0 | 1 | 0 | SELECT BANK B, SUB-BANK (m) |
| ROW D | 0 | 1 | 1 | SELECT BANK B, SUB-BANK (n) |
| ROW E | 1 | 0 | 0 | SELECT BANK C, SUB-BANK (p) |
| ROW F | 1 | 0 | 1 | SELECT BANK C, SUB-BANK (q) |
| ROW G | 1 | 1 | 0 | SELECT BANK D, SUB-BANK (r) |
| ROW H | 1 | 1 | 1 | SELECT BANK D, SUB-BANK (s) |

FIG. 3

SEMICONDUCTOR MEMORY HAVING A BANK WITH SUB-BANKS

BACKGROUND OF THE INVENTION

Modern computer systems typically contain a memory device such as a dynamic random access memory (DRAM), synchronous DRAM (SDRAM), double-data rate DRAM (DDR-DRAM), low power DDR-DRAM (LP DDR-DRAM) or other memory devices which may be used to store data for the computer system.

Frequent accesses to these memory devices are often required to store and manipulate data used by a variety of different computer programs. However, the accesses to these memory devices are generally limited by timing parameters, which prevent accesses to the memory until these timing parameters are met.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 is a diagram representing behavior of a chip interface/control circuit according to one embodiment.

DETAILED DESCRIPTION OF THE PREFERRED EMBODIMENT

Figure 1:
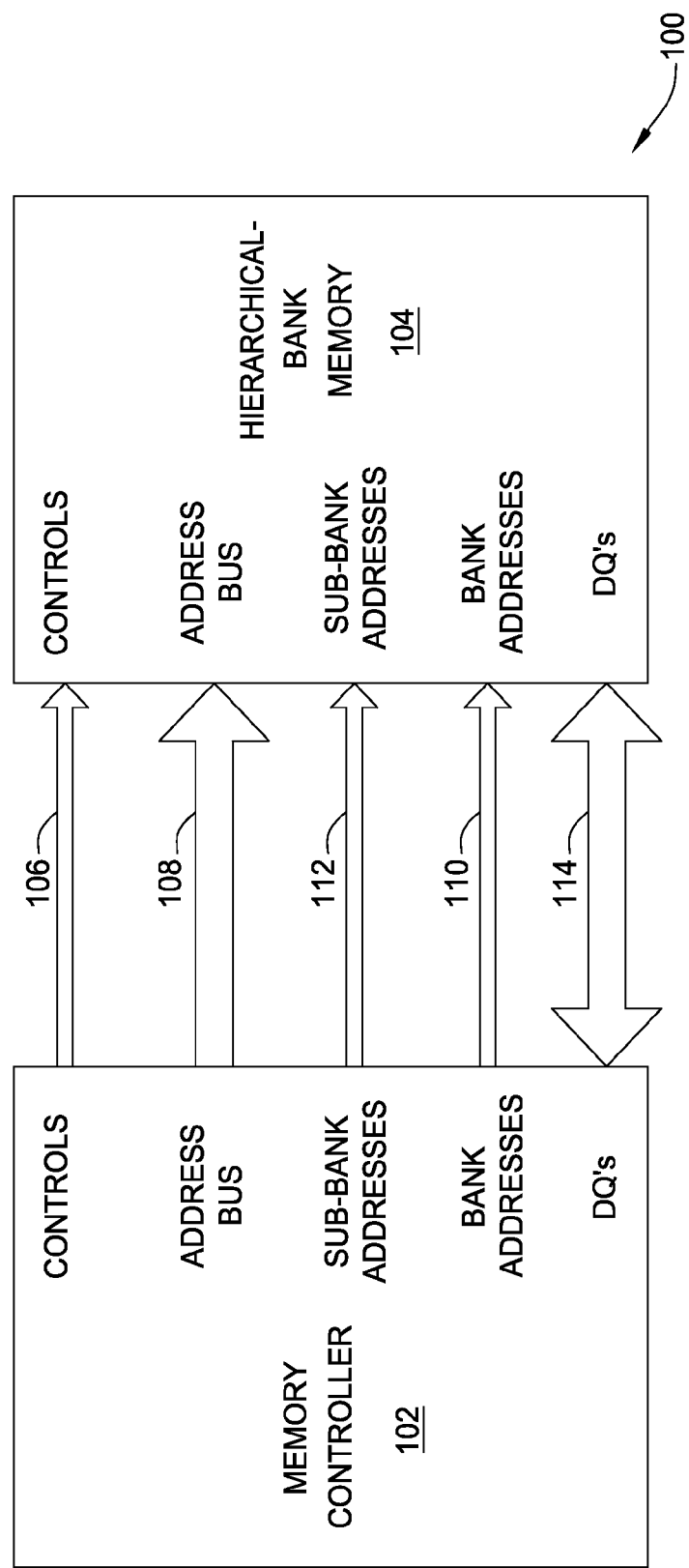
FIG. 1 illustrates an exemplary system according to an embodiment.

Embodiments of the invention generally provide techniques that allow an additional level of hierarchy within a bank of a Dynamic Random Access Memory (DRAM). The added-level of hierarchy may allow for faster access times for subsequent accesses to the same bank of a DRAM, and may also provide techniques that improve data bus utilization.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

Whether the memory is integrated into a device with other circuits or provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including devices with the same type of memory, devices with different types of memory, and/or devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

One embodiment provides a hierarchical-bank memory. The hierarchical-bank memory generally comprises a plurality of input address pins and a plurality of banks. The selection of a sub-bank is determined by the plurality of input address pins. Furthermore, a minimum allowable time interval between successive commands to different sub-banks of the same bank (tRCsub) is shorter than a minimum allowable time interval between successive commands to the same sub-bank (tRC) of the same bank.

Another embodiment provides a hierarchical-bank memory. The hierarchical-bank memory generally comprises a plurality of banks of memory cells. Each bank generally comprises a plurality of separately addressable sub-banks. Each bank also generally comprises a sub-bank interface for each of the separately addressable sub-banks. The activation of a sub-bank interface is determined by a plurality of address pins. Each bank also generally comprises a row decoder for each of the separately addressable sub-banks. Each row decoder is configured to activate a word line of a respective sub-bank in response to one or more control signals and one or more address signals received from a respective sub-bank interface. Furthermore, a minimum allowable time interval between successive commands to different sub-banks of the same bank (tRCsub) is shorter than a minimum allowable time interval between successive commands to the same sub-bank (tRC) of the same bank.

Another embodiment provides a method for accessing a hierarchical bank memory, wherein the hierarchical bank memory comprises a plurality of sub-banks. The method includes the steps of receiving a command from a controller via a control bus, receiving an address associated with the command from the controller via one or more address buses, and configuring a plurality of sub-bank interfaces located in the hierarchical bank memory to select a respective row decoder located in the hierarchical bank memory in response to the address. The number of sub-bank interfaces and respective row decoders is equal to a number of sub-banks within the hierarchical bank memory. The method also comprises the step of activating the respective row decoder located in the hierarchical bank memory in response to one or more control signals and one or more address signals, received from a respective sub-bank interface, thereby activating a word line of a respective sub-bank. The activation of a sub-bank interface is determined by the address received via the one or more address buses. Furthermore, a minimum allowable time interval between successive commands to different sub-banks of a same bank (tRCsub) is shorter than a minimum allowable time interval between successive commands to the same sub-bank (tRC) of the same bank.

Another embodiment provides a system. The system generally comprises a controller and at least one memory device communicatively coupled to the controller. The at least one memory device generally comprises a plurality of banks of memory cells. Each bank comprises a plurality of separately addressable sub-banks. The at least one memory device also generally comprises a sub-bank interface for each of the separately addressable sub-banks, and a row decoder for each of the separately addressable sub-banks configured to activate a word line of a respective sub-bank in response to one or more control signals and one or more address signals received from a respective sub-bank interface. The selection of a sub-bank interface is determined by a plurality of address pins. Furthermore, a minimum allowable time interval between successive commands to different sub-banks of the same bank (tRCsub) is shorter than a minimum allowable time interval between successive commands to the same sub-bank (tRC) of the same bank.

Yet another embodiment provides a hierarchical-bank memory. The hierarchical-bank memory generally comprises a plurality of input address pins and a plurality of banks. Each of the plurality of banks generally comprises a plurality of sub-banks. The selection of a sub-bank is determined by the plurality of input address pins. Each of the plurality of banks also generally comprises a sub-bank interface for each of the separately addressable sub-banks, a row decoder for each of the plurality of sub-banks configured to activate a word line of a respective sub-bank in response to one or more control signals and one or more address signals received from a respective sub-bank interface, and a column decoder configured to access a column of any of the plurality of sub-banks. The column decoder is activated in response to one or more control signals and one or more address signals received by a sub-bank interface.

FIG. 1 is a block diagram illustrating an exemplary embodiment of a system 100 including a memory controller 102 and a hierarchical-bank memory 104. A control bus 106 and an address bus 108 may couple the memory controller 102 to the hierarchical-bank memory 104 to facilitate access of data located within the hierarchical-bank memory 104. The memory controller 102 can execute various commands across the control bus 106 to perform different operations, such as a read or write, to the memory 104. For example, when performing a read operation, the memory controller 102 may provide an address to the hierarchical-bank memory 104 via the address bus 108. Subsequently, the hierarchical-bank memory 104 may return data stored at that address via a data bus 114. When performing a write operation, the memory controller 102 may provide the hierarchical-bank memory 104 with the address (via the address bus 108), and the data to be stored at that address (via the data bus 114).

In some embodiments, multiple address buses may be coupled between the memory controller 102 and the hierarchical-bank memory 104. In this case, each address bus may be used to access different hierarchies of the hierarchical-bank memory 104. For example, as illustrated in FIG. 1, a bank address 110 bus, a sub-bank address bus 112, and an address bus 108 are coupled between the memory controller 102 and the hierarchical-bank memory 104. The bank address bus 110 can be used to access different banks within the memory 104, the sub-bank address bus 112 can be used to access different sub-banks (described below with respect to FIG. 2) within a bank, and the address bus 108 can be used to access a location of memory within a sub-bank. In embodiments where a plurality of memories are contained in a memory module, the memory system 100, may also include a rank address bus (or chip-selects), which can be used to select different memories within the memory module.

Figure 2:
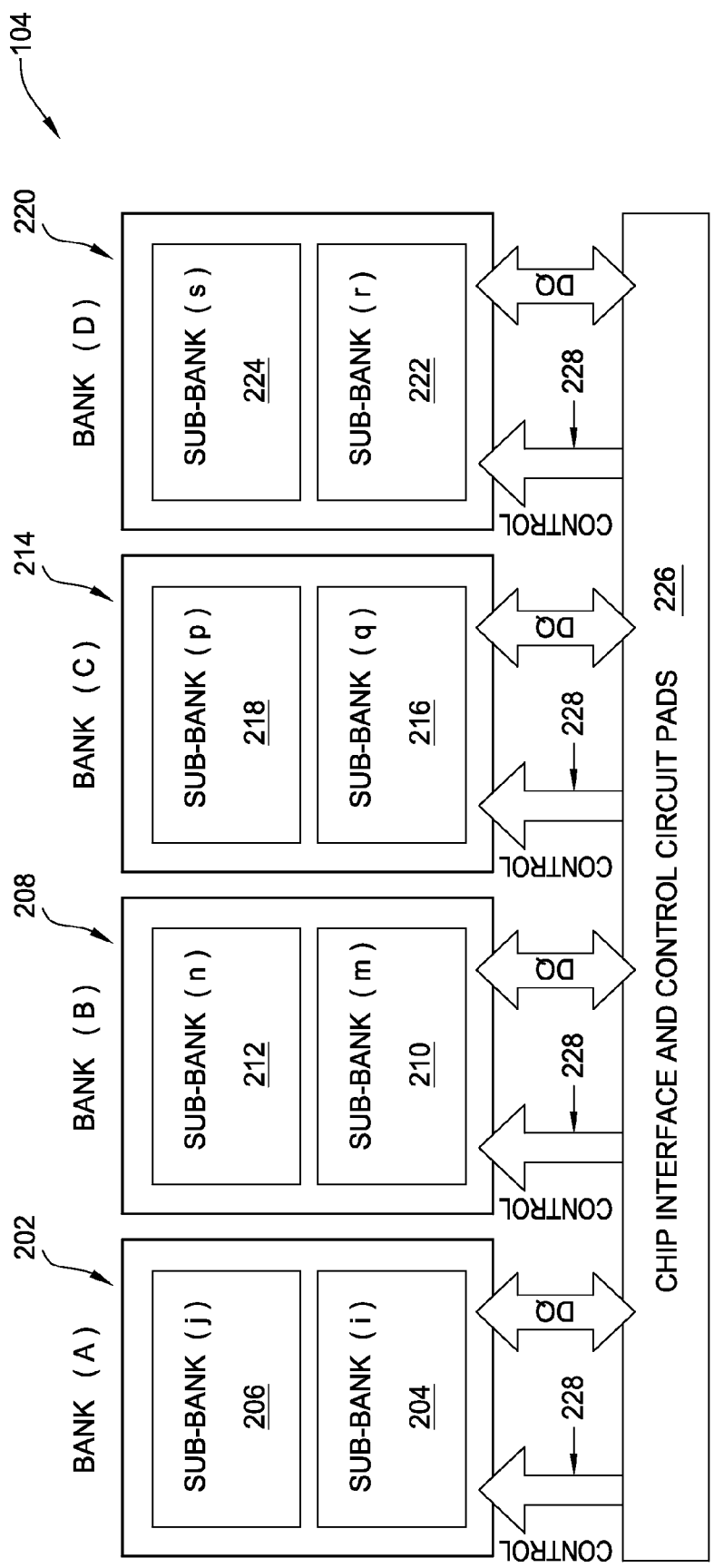
FIG. 2 illustrates an exemplary hierarchical DRAM according to an embodiment of the invention.

FIG. 2 illustrates a hierarchical-bank DRAM 104 containing banks and sub-banks. For illustrative purposes, FIG. 2 shows a DRAM having only four banks, where each bank has two sub-banks. However, the number of banks and sub-banks may change according to the needs of a particular application. As illustrated in FIG. 2, the DRAM 104 contains four banks (A-D). A first bank 202 (Bank A) contains a first sub-bank 204 (sub-bank (i)) and second sub-bank 206 (sub-bank(j)). A second bank 208 (Bank B) contains a third sub-bank 210 (sub-bank(m)) and a fourth sub-bank 212 (sub-bank(n)), A third bank 214 (Bank C) contains a fifth sub-bank 216 (sub-bank (p)) and a sixth sub-bank 218 (sub-bank(q)). A fourth bank 220 (Bank D) contains a seventh sub-bank 222 (sub-bank(r)) and an eight sub-bank 224 (sub-bank(s)). As stated earlier, each bank and sub-bank is selectable via the various address buses (shown in FIG. 1). The addresses sent via the address buses are received by a chip interface/control circuit 226 located in the DRAM 104. The chip interface/control circuit 226 subsequently decodes the address buses and provides control signals 228 to each bank so that the selected bank responds to the access request to the DRAM 104.

FIG. 3 illustrates a truth table 300 representing one embodiment of how the chip interface/control circuit 226 may decode the various address buses to provide control signals to the various banks and sub-banks of a DRAM 104 as shown in FIG. 2. Columns 302, 303 and 304 represent bank address[1], bank address[0] and the sub-bank address, respectively. Each of the rows (Rows A-H) represent a different combination of values for bank address[1], bank address [0] and the sub-bank address. Column 305 represents the result or action that takes place depending on the values of bank address[1], bank address[0] and the sub-bank address.

For example, in the event that both bank address bits 302, 303 are equal to zero (as illustrated by Rows A and B), bank A can be selected. In the event that bank address[0] 303 is equal to one and bank address[1] 302 is equal to zero, bank B can be selected (as illustrated by Rows C and D). In the event that bank address[1] 302 is equal to one and bank address[0] 303 is equal to zero, bank C can selected (as illustrated by Rows E and F). Finally, in the event that both bank address bits 302, 303 are equal to one, bank D can be selected (as illustrated by Rows G and H).

Once a bank is selected, the chip interface/control circuit 226 may determine which sub-bank to select by utilizing the sub-bank address bit 304. For example, in the case where bank A is selected (as illustrated by Rows A and B), sub-bank (i) 202 can be selected if the sub-bank address bit 304 is equal to zero. Conversely, sub-bank(j) 206 can be selected if the sub-bank address bit 304 is equal to one. In the case where bank B is selected (as illustrated by Rows C and D), sub-bank (m) 210 can be selected if the sub-bank address bit is equal to zero. Conversely, sub-bank(n) 212 can be selected if the sub-bank address bit 304 is equal to one, etc. In this way, each bank and sub-bank can be individually selected.

Additionally, in one embodiment, the chip interface/control unit 226 may also decode the address bus 108 to provide a row and column address to row and column decoders, respectively (described further below with respect to FIG. 4).

Figure 4:
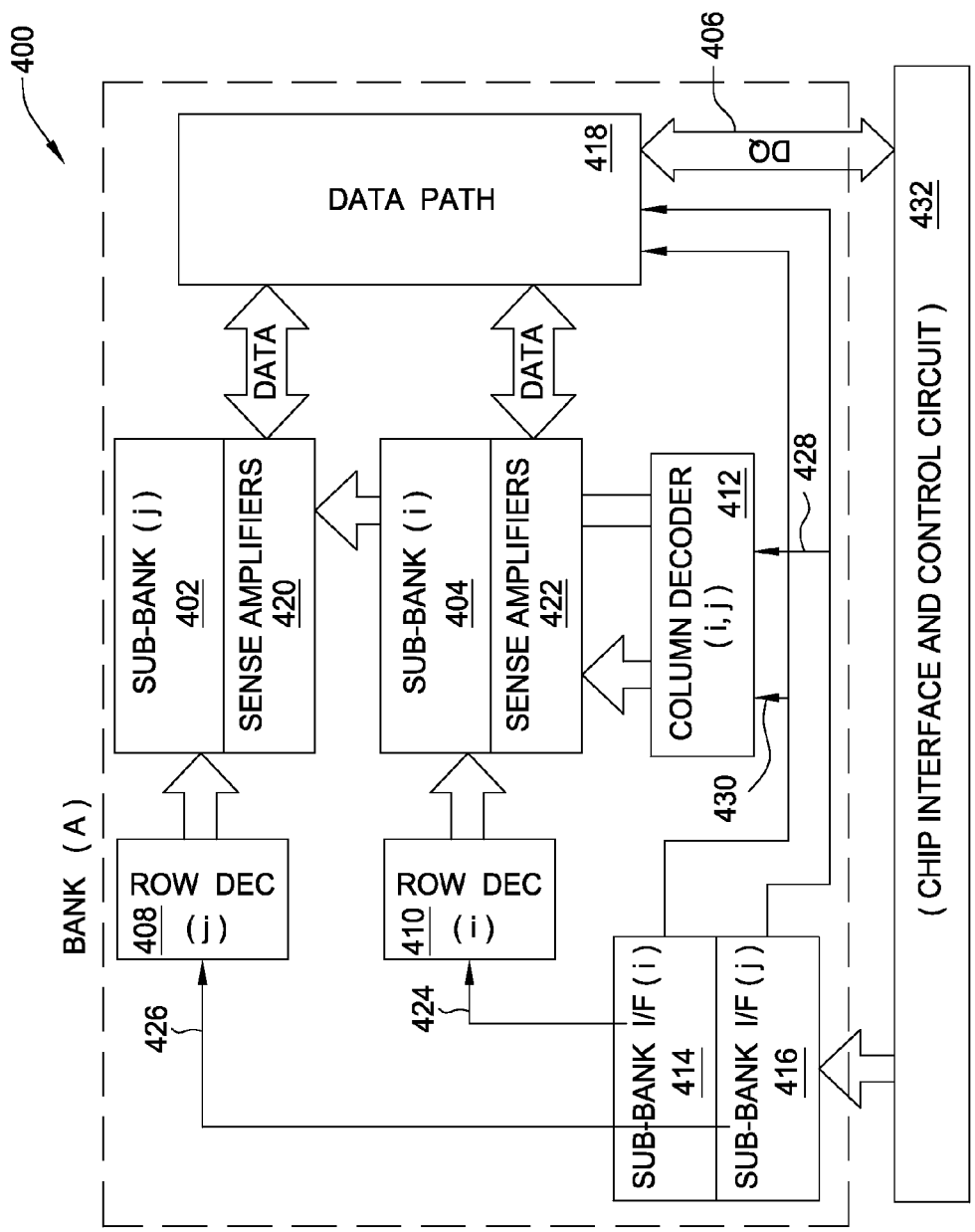
FIG. 4 illustrates a bank according to an embodiment of the invention.

FIG. 4 illustrates a memory bank 400 with two exemplary sub-banks (sub-bank(i) 404 and sub-bank(j) 402). The memory bank 400 may be representative of any of the banks 202, 208, 214, 220 shown in FIG. 2.

In addition to having a number of sub-banks, each bank 400 may also contain logic to control and select data located in each sub-bank. For example, a bank may contain a row decoder 408, 410 for each sub-bank to activate a proper word line of its respective sub-bank. Furthermore, the bank may also contain a column decoder 412 to activate a proper column bit line to select a particular memory cell on the active row. Once the cell is selected, a value stored (i.e., a voltage level) in the cell is ultimately driven out as data over a data bus 406 via sense amplifiers 420, 422 located in the sub-banks 402, 404. Additionally, the bank 400 may also contain a sub-bank interface 414, 416 for each sub-bank. The sub-bank interfaces 414, 416 may be configured to control a respective one of the row decoders 408, 410 (via row control and timing signals 424, 426) and the column decoder 412 (via column control and timing signals 428, 430) to utilize the data path 418 and data bus 406.

The sub-bank interfaces 414, 416 may provide the timing signals 424, 426, 428, 430 in response to a read or write command and control and address signals received from the chip interface/control circuit 432. Additionally, in one embodiment, the column control and timing signals 428, 430 may be provided to the column decoder 412 once the sense amplifiers 420, 422 are ready for a column operation.

In one embodiment, as illustrated in FIG. 4, the sub-banks 402, 404 may share the same data path 418. In another embodiment, each sub-bank 402, 404 may utilize a different data path. The data path 418 may include a data bus 406, secondary sense amplifiers (not shown), and a write data driver (not shown). The data bus 406 may be configured to transfer data between the sub-banks 402, 404 and the chip interface/control circuit 432. The secondary sense amplifiers (not shown) may be configured to read the data from the sense amplifiers 420, 422 located within the sub-banks 402, 404. The write data driver (not shown) may be configured to drive data from the data bus 406 and to the sub-banks 402, 404 during a write command. The data path may also include an additional data bus (not shown) between the secondary sense amplifiers and data output circuits (not shown) located in the chip interface/control block 432. The data path may also include a data bus (not shown) between the write data driver and data output circuits (not shown) located in the chip interface/control block 432.

In one embodiment, the hierarchical bank configuration, as described above with reference to FIG. 2, may utilize the data path 418 and data bus 406 by pipelining accesses (i.e., allowing multiple read requests to the same bank without having to wait for return data) to different sub-banks of the same bank (described further below with respect to FIGS. 6 and 7). Furthermore, the hierarchical bank configuration may reduce the minimum allowable time interval required before a subsequent access to a DRAM may occur.

When accessing memory, certain timing parameters (or minimum allowable time intervals) must be met before the access can occur. Depending on what portion of memory is being accessed, the required minimum allowable time intervals can vary. For example, when accessing a sub-bank of a bank of a memory device, the minimum allowable time interval required before executing a subsequent access to the same sub-bank is equal to the number of clock cycles a memory row takes to complete a full cycle (from row activation to precharging the active row). This time interval is also known as the row cycle time (tRC). If a subsequent access to a same sub-bank occurs before tRC is met, data loss or corruption may occur because the row may not be sufficiently precharged. Therefore, it may be required to wait until tRC elapses before performing a subsequent access to the same sub-bank.

Figure 5:
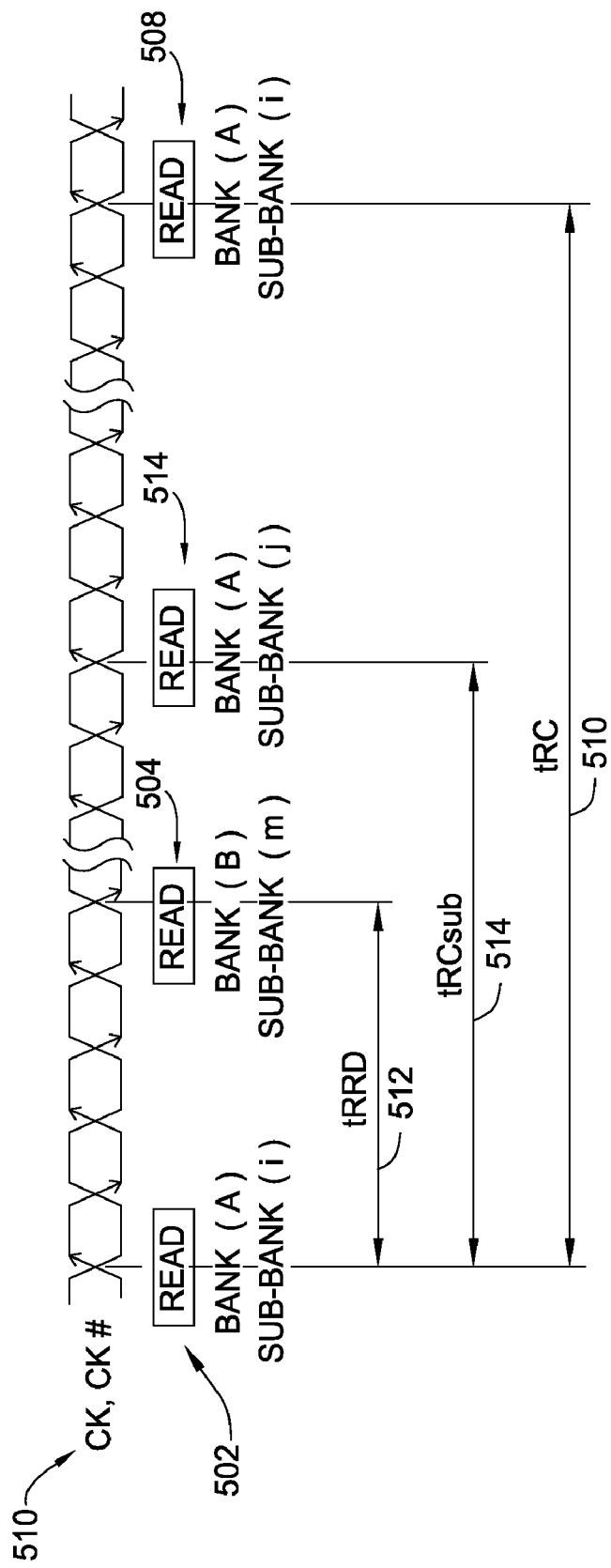
FIG. 5 illustrates a timing diagram of bank and sub-bank accesses according to an embodiment of the invention.

FIG. 5 illustratively shows an example of a subsequent read to the same sub-bank of a bank. FIG. 5 illustrates a timing diagram with four read transactions. A first read 502 occurs to Bank A, sub-bank(i), a second read 504 occurs to Bank B, sub-bank(m), a third read 506 occurs to Bank A, sub-bank(j) and a fourth read 508 occurs to Bank A, sub-bank(i). In one embodiment, the read transactions are sampled using a differential clock signal 510. The differential clock signal 510 may include a clock signal (CK) and its negative complement (CK#). In this case, each of the read commands may be sampled during a positive (or negative edge) of the differential clock signal. In another embodiment, a single-ended clock signal may be provided, where each of the read commands may be sampled during a positive edge of the single-ended clock signal.

As illustrated in FIG. 5, the first read 502 and the fourth read 508 are both to Bank A, sub-bank(i). Because the first read 502 and the fourth read 508 are to the same sub-bank of bank A, the minimum allowable time interval required before executing the fourth read 508 may be tRC 510.

A different minimum allowable time interval may be required when performing a subsequent access to a different bank of a memory device. This interval is known as the row-to-row delay (tRRD). Generally, tRRD is provided by DRAM vendors to limit the peak current flow and mitigate thermal issues by managing power consumption, sharing circuitry, signals, power, etc. among the banks.

Referring back to FIG. 5, FIG. 5 illustratively shows an example of a subsequent read to a different bank. The first read 502 and the second read 504 are to Bank A, sub-bank(i) and Bank B, sub-bank(m), respectively. Because the first read 502 and the second read 504 are to different banks, the minimum allowable time interval required before executing the second read 504 may be tRRD 512.

In a hierarchical bank configuration as illustrated in FIG. 4, as described above with reference to FIG. 2, another minimum allowable time interval may be required when performing a subsequent access to a different sub-bank of the same bank. This minimum time interval may be shorter than tRC. This is possible because the sub-banks are not bound by the row activation/deactivation times of other sub-banks. In this case, each sub-bank functions independently from each other. As a result, only the sub-bank accessed is unavailable for subsequent accesses until tRC has elapsed, while other sub-banks within the bank remain accessible before tRC elapses.

By allowing a subsequent access to a different sub-bank, the minimum allowable time interval to access the same bank in a subsequent access, in effect, may result in a minimum allowable time interval shorter than tRC. In cases where a subsequent cycle is to a different sub-bank of a bank previously accessed, the requirement to wait for the row activation/deactivation that typically occurs before accessing a same bank or sub-bank is eliminated due to the independence of the sub-banks.

The required minimum allowable time interval for accesses to a different sub-bank of the same bank is referred to as tRCsub in FIG. 5. FIG. 5 illustratively shows an example of a subsequent read to a different sub-bank of the same bank. The first read 502 and the third read 506 are to Bank A, sub-bank(i) and Bank A, sub-bank(j), respectively. Because the first read 502 and the third read 506 are to different sub-banks of the same bank, the minimum allowable time interval required before executing the third read 506 is tRCsub 514. In one embodiment, tRCsub 512 may be a shorter interval than tRRD 512. In another embodiment, tRCsub 512 may be a longer interval than tRRD 512.

As stated earlier, each sub-bank 402, 404 has a row decoder 408, 410. As a result, when accessing a different sub-bank of the same bank, it is not required to wait for the row activation/deactivation cycle to complete. Therefore, in one embodiment, it may be possible to access a different sub-bank in the same bank without any required minimum allowable time interval (tRCsub).

However, in a configuration where the sub-banks share the same data path 418, as illustrated in FIG. 4, simultaneous accesses to the sub-banks 402, 404 may result in an overlapping of data on the data bus 406. To prevent any such overlapping, the sub-bank interfaces 414, 416 may be configured to control the column decoder 412 to time the column accesses to each sub-bank such that no overlapping occurs (further described below with respect to FIGS. 6 and 7). Therefore, in an embodiment where the data path is shared between the sub-banks 402, 404, tRCsub may be limited to (and defined as) the time it takes for the column decoder 412 to access the column of the sub-bank. Furthermore, column access times are generally much shorter than row access times (due to the inherent nature of activating an addressed row of memory cells in a memory-cell array versus accessing an addressed memory-cell in one of the columns within the activated row). Therefore, as stated earlier, tRCsub may be much shorter than tRC.

Configuring the sub-bank interfaces to control the row decoders 414, 416 and column decoder 412 to prevent overlapping of data may also allow pipelined accesses to different sub-banks of the same bank. The steps for pipelining accesses are illustrated in the block diagram of FIG. 6. FIG. 6 may be best described using the timing diagram illustrated in FIG. 7.

Figure 7:
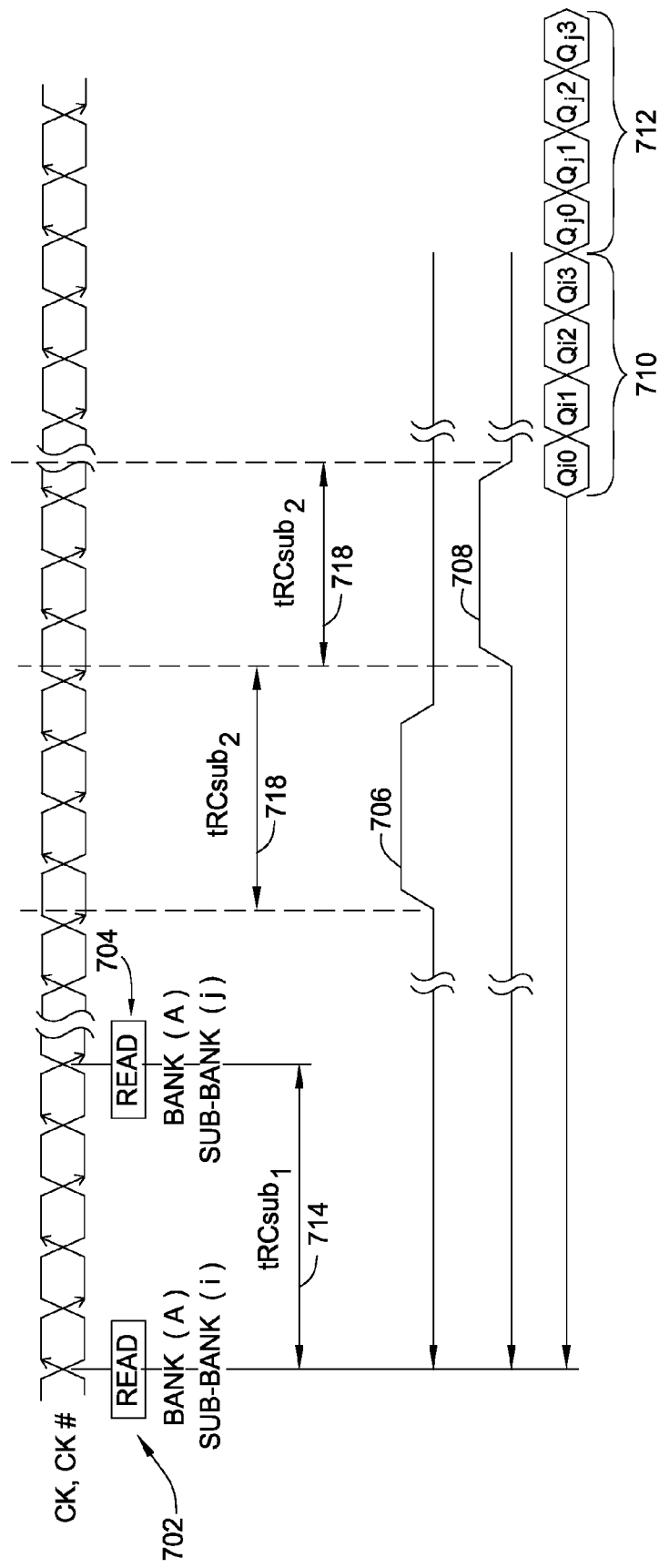
FIG. 7 illustrates a timing diagram of back-to-back sub-bank operations according to an embodiment of the invention.

FIG. 7 illustrates a timing diagram with two read transactions. In one embodiment, the read transactions are sampled using a differential clock signal 700. The differential clock signal 700 may include a clock signal (CK) and its negative complement (CK#). As illustrated in FIG. 7, both read transactions are executed before the data for each read transaction ((Qi0-3) 710 and (Qj0-3) 712) is returned.

The first read 702 corresponds to the first access of bank A, sub-bank(i). Step 1 of FIG. 6 illustrates the control path for selecting sub-bank(i) 404 for access. The sub-bank interface (i) 414 may receive a control signal and a row and column address indicating the selection of sub-bank(i) 404 from the chip interface/control circuit 226. Subsequently, the sub-bank interface(i) 414 may send a row address to the row decoder(i) 410. The row decoder(i) 410 may decode the row address and activate the proper row so that all the cells on that row become active (i.e., the logical values are driven into the sense amplifiers 420, 424).

Subsequently, after tRCsub$_1$ 714 has elapsed and before the first read 702 is complete, a second read 704 to bank A, sub-bank(j) occurs. Step 2 of FIG. 6 illustrates the control path for selecting sub-bank(j) 402 according to the second read 704. The sub-bank interfaces(j) 416 may receive a control signal and a row and column address indicating the selection of sub-bank(j) 402 from the chip interface/control circuit 226. Subsequently, the sub-bank interfaces(j) 416 may send a row address to the row decoders(j) 408. The row decoders(j) 408 may decode the row address and activate the proper row line so that all the cells on that row become active.

Then, as illustrated in FIG. 7, a first column access 706 to sub-bank(i) occurs, which is followed by a second column access 708 to sub-bank(j). As illustrated in FIG. 7, the time to complete each column access 706, 708 is tRCsub$_2$ 718. Referring to Step 3 of FIG. 6, the first column access can be initiated by the sub-bank interface(i) 414. The sub-bank interface(i) 414 may send the column address to the column decoder 412. The column decoder 412 may then decode the column address and activate the proper column line, selecting which particular cell on the active row is ultimately to be sent as data over the data bus 406 (via the sense amplifiers 420, 424).

Figure 6:
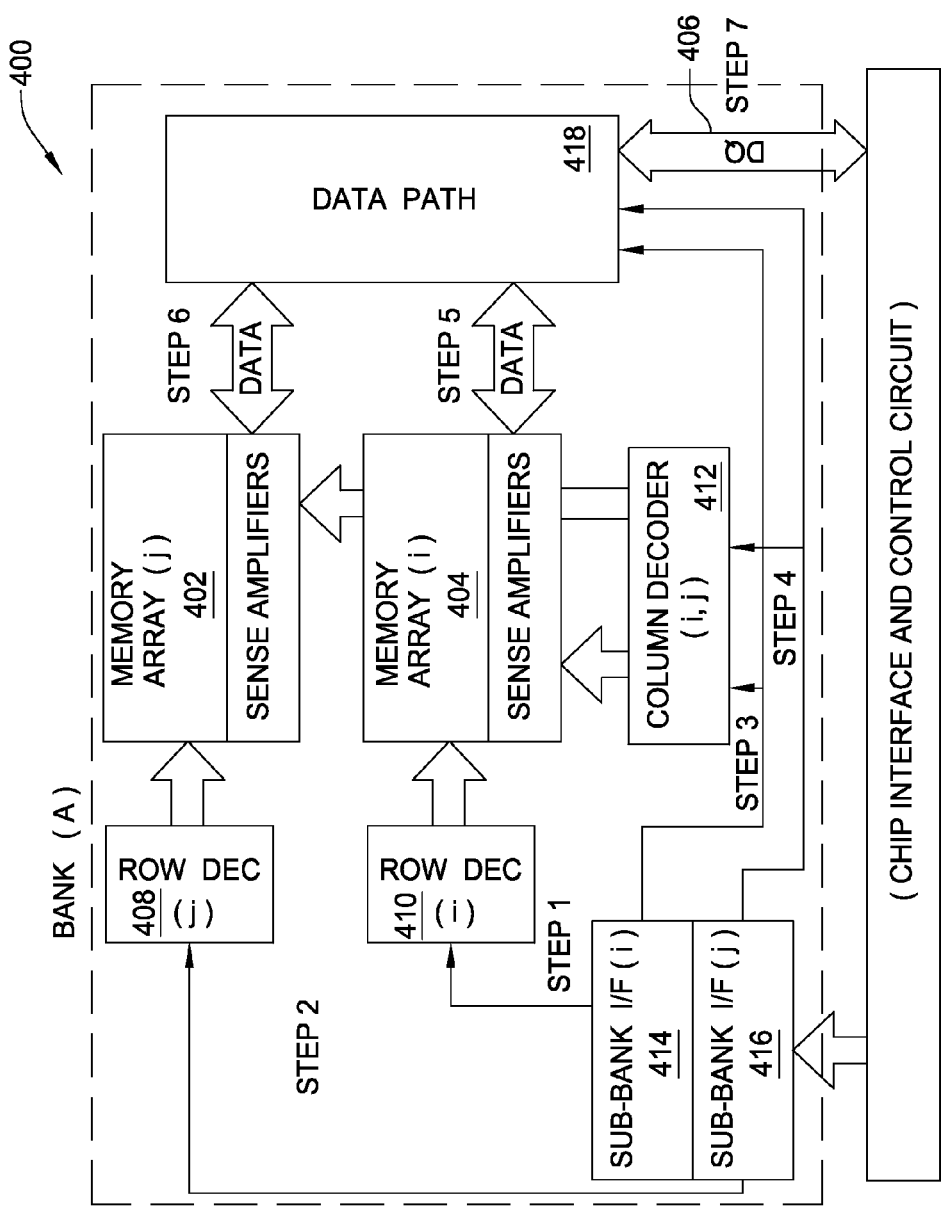
FIG. 6 illustrates exemplary operations for optimizing a data bus according to an embodiment of the invention.

After the first column access 706 completes, the second column access 708 may be initiated by sub-bank interfaces(j) 416, as illustrated in Step 4 of FIG. 6. The sub-bank interfaces (j) 416 may send the column address to the column decoder 412. Subsequently, the column decoder 412 may decode the column address and activate the proper column line, selecting which particular cell on the active row to send as data over the data bus 406 (via the sense amplifiers 420, 424).

Thereafter, the data from the sub-banks 402, 404 may be transferred to the data path 418 in Steps 5 and 6, respectively. Subsequently, in Step 7, the data is transferred from the data path 418 and on to the data bus 406. As illustrated in FIG. 7, the data read from sub-bank(i) (Qi0-3) 710 is transferred via the data bus 406 after the column accesses 706, 708 occur. After the data transfer for sub-bank(i) (Qi0-3) 710 is complete, the data read from sub-bank(j) (Qj0-3) 712 is transferred via the data bus 406.

In one embodiment, the sub-bank interfaces may be configured to initiate the second column access as soon as the first column access completes, thus resulting in back-to-back column accesses. This can be accomplished by configuring the sub-bank interfaces 416, 418 to wait until tRCsub elapses (the time it takes to complete a column access) before initiating the next column access.

Embodiments described herein provide a memory device having a plurality of banks, wherein each bank comprises a plurality of sub-banks. In one aspect, such a memory device may provide the advantage of faster access times to a memory device without increasing the number of banks (and consequently increasing the die size) of the memory device.

While the foregoing is directed to embodiments of the present invention, other and further embodiments of the invention may be devised without departing from the basic scope thereof, and the scope thereof is determined by the claims that follow.

What is claimed is:

1. A hierarchical-bank memory, comprising:
   a plurality of input address pins; and
   a plurality of banks, wherein each of the plurality of banks comprises:
      a plurality of sub-banks, wherein a selection of a sub-bank is determined by the plurality of input address pins and wherein a minimum allowable time interval between successive commands to different sub-banks of the same bank (tRCsub) is shorter than a minimum allowable time interval between successive commands to the same sub-bank (tRC) of the same bank.

2. The memory of claim 1, wherein one or more pins of the plurality of input address pins are provided to selectively address the plurality of sub-banks of the hierarchical-bank memory.

3. The memory of claim 1, wherein tRCsub is shorter than a minimum allowable time interval between successive commands to different banks of the hierarchical-bank memory (tRRD).

4. The memory of claim 1, wherein tRCsub is longer than a minimum allowable time interval between successive commands to different banks of the hierarchical-bank memory (tRRD).

5. A hierarchical-bank memory, comprising:
a plurality of banks of memory cells, wherein each bank comprising a plurality of separately addressable sub-banks;
a sub-bank interface for each of the separately addressable sub-banks, wherein activation of a sub-bank interface is determined by a plurality of address pins; and
a row decoder for each of the separately addressable sub-banks configured to activate a word line of a respective sub-bank in response to one or more control signals and one or more address signals received from a respective sub-bank interface, wherein a minimum allowable time interval between successive commands to different sub-banks of the same bank (tRCsub) is shorter than a minimum allowable time interval between successive commands to the same sub-bank (tRC) of the same bank.

6. The memory of claim 5, wherein one or more pins of the plurality of address pins are provided to selectively address the plurality of separately addressable sub-banks of the hierarchical-bank memory.

7. The memory of claim 5, wherein the hierarchical bank memory further comprises a column decoder configured to access a column of any of the plurality of separately addressable sub-banks, and wherein the column decoder is activated in response to one or more control signals and one or more address signals received by a sub-bank interface.

8. The memory of claim 5, wherein the separately addressable sub-banks share a common data path.

9. The memory of claim 7, wherein a first sub-bank interface is configured to control the column decoder to initiate a first column access, and wherein a second sub-bank interface is configured to control the column decoder to initiate a second column access after tRCsub for the first column access elapses.

10. The memory of claim 5, wherein tRCsub is shorter than a minimum allowable time interval between successive commands to different banks of the hierarchical-bank memory (tRRD).

11. The memory of claim 5, wherein tRCsub is longer than a minimum allowable time interval between successive commands to different banks of the hierarchical-bank memory (tRRD).

12. A method for accessing a hierarchical bank memory, wherein the hierarchical bank memory comprises a plurality of sub-banks, comprising:
receiving a command from a controller via a control bus;
receiving an address associated with the command from the controller via one or more address buses;
configuring a plurality of sub-bank interfaces located in the hierarchical bank memory to select a respective row decoder located in the hierarchical bank memory in response to the address, wherein a number of sub-bank interfaces and respective row decoders is equal to a number of sub-banks within the hierarchical bank memory; and
activating the respective row decoder located in the hierarchical bank memory in response to one or more control signals and one or more address signals, received from a respective sub-bank interface, thereby activating a word line of a respective sub-bank, wherein activation of a sub-bank interface is determined by the address received via the one or more address buses and wherein a minimum allowable time interval between successive commands to different sub-banks of a same bank (tRCsub) is shorter than a minimum allowable time interval between successive commands to the same sub-bank (tRC) of the same bank.

13. The method of claim 12, wherein each of the one or more address buses bus is configured to access a different hierarchy of the hierarchical-bank memory.

14. The method of claim 12, wherein the method further comprises the step of:
configuring a column decoder located in the hierarchical bank memory to access a column of any of the plurality of sub-banks, and wherein the column decoder is activated in response to one or more control signals and one or more address signals received by a sub-bank interface.

15. The method of claim 14, wherein the method further comprises the steps of:
configuring a first sub-bank interface to control the column decoder to initiate a first column access; and
configuring a second sub-bank interface to control the column decoder to initiate a second column access after tRCsub for the first column access elapses.

16. The method of claim 12, wherein tRCsub is shorter than a minimum allowable time interval between successive commands to different banks of the hierarchical-bank memory (tRRD).

17. The method of claim 12, wherein tRCsub is longer than a minimum allowable time interval between successive commands to different banks of the hierarchical-bank memory (tRRD).

18. A system, comprising:
a controller; and
at least one memory device communicatively coupled to the controller, comprising:
a plurality of banks of memory cells, each bank comprising a plurality of separately addressable sub-banks;
a sub-bank interface for each of the separately addressable sub-banks; and
a row decoder for each of the separately addressable sub-banks configured to activate a word line of a respective sub-bank in response to one or more control signals and one or more address signals received from a respective sub-bank interface; wherein a selection of a sub-bank interface is determined by a plurality of address pins and wherein a minimum allowable time interval between successive commands to different sub-banks of the same bank (tRCsub) is shorter than a minimum allowable time interval between successive commands to the same sub-bank (tRC) of the same bank.

19. The system of claim 18, wherein the plurality of address pins are coupled between the controller and the memory device, and wherein one or more pins of the plurality of address pins are provided to selectively address the plurality of separately addressable sub-banks of the memory device.

20. The system of claim 18, wherein the memory device further comprises a column decoder configured to access a column of any of the plurality of separately addressable sub-banks, and wherein the column decoder is activated in response to one or more control signals and one or more address signals received by a sub-bank interface.

21. The system of claim 18, wherein the separately addressable sub-banks share a common data path.

22. The system of claim 20, wherein a first sub-bank interface is configured to control the column decoder to activate a first column access, and a second sub-bank interface is configured to control the column decoder to initiate a second column access after tRCsub for the first column access elapses.

23. The system of claim 18, wherein tRCsub is shorter than a minimum allowable time interval between successive commands to different banks of the memory device (tRRD).

24. The system of claim 18, wherein tRCsub is longer than a minimum allowable time interval between successive commands to different banks of the memory device (tRRD).

* * * * *